United States Patent
Kang et al.

(10) Patent No.: US 9,460,986 B2
(45) Date of Patent: Oct. 4, 2016

(54) METHOD OF MANUFACTURING SEMICONDUCTOR PACKAGE SUBSTRATE WITH LIMITED USE OF FILM RESIST AND SEMICONDUCTOR PACKAGE SUBSTRATE MANUFACTURED USING THE SAME

(71) Applicant: HAESUNG DS CO., LTD, Changwon-si (KR)

(72) Inventors: Sung Il Kang, Changwon-si (KR); In Seob Bae, Changwon-si (KR); Min Seok Jin, Changwon-si (KR)

(73) Assignee: HAESUNG DS CO., LTD, Changwon-si (KR)

( * ) Notice: Subject to any disclaimer, the term of this patent is extended or adjusted under 35 U.S.C. 154(b) by 0 days.

(21) Appl. No.: 14/589,034

(22) Filed: Jan. 5, 2015

(65) Prior Publication Data

US 2015/0194323 A1 Jul. 9, 2015

(30) Foreign Application Priority Data

Jan. 3, 2014 (KR) .................. 10-2014-0000832
Jan. 3, 2014 (KR) .................. 10-2014-0000833

(51) Int. Cl.
| | |
|---|---|
| *H01L 21/76* | (2006.01) |
| *H01L 21/302* | (2006.01) |
| *H01L 21/311* | (2006.01) |
| *H01L 23/48* | (2006.01) |
| *H01L 23/498* | (2006.01) |
| *H01L 21/48* | (2006.01) |

(52) U.S. Cl.
CPC ............ *H01L 23/481* (2013.01); *H01L 21/486* (2013.01); *H01L 23/49827* (2013.01); *H01L 2924/0002* (2013.01)

(58) Field of Classification Search
CPC .......... H01L 23/481; H01L 23/49827; H01L 21/486; H01L 2924/0002; H01L 21/76205; H01L 21/76224; H01L 21/76264; H01L 21/302; H01L 21/02065; H01L 21/02074; H01L 21/30655; H01L 21/31051; H01L 21/32115; H01L 21/76819; H01L 21/7684; H01L 21/76808; H01L 29/6634; H01L 29/66621
USPC ...................... 438/444, 494, 689, 697, 735
See application file for complete search history.

(56) References Cited

U.S. PATENT DOCUMENTS 5,629,835 A    5/1997   Mahulikar et al.
2012/0018867 A1  1/2012   Toda et al.

FOREIGN PATENT DOCUMENTS

JP       2010-232216 A   10/2010
KR    10-2013-0101198 A   9/2013

*Primary Examiner* — A. Sefer
*Assistant Examiner* — Dilinh Nguyen
(74) *Attorney, Agent, or Firm* — Sughrue Mion, PLLC (57) ABSTRACT

A method of manufacturing a semiconductor package substrate has a simplified process and an upper and lower pattern alignment problem is solved. A semiconductor package substrate is manufactured by the method. The method of manufacturing a semiconductor package substrate includes forming a first groove in one surface of a base substrate of a conductive material, filling the first groove with resin, and etching another surface of the base substrate to expose the resin filling the first groove.

9 Claims, 5 Drawing Sheets

METHOD OF MANUFACTURING SEMICONDUCTOR PACKAGE SUBSTRATE WITH LIMITED USE OF FILM RESIST AND SEMICONDUCTOR PACKAGE SUBSTRATE MANUFACTURED USING THE SAME

RELATED APPLICATIONS

This application claims the benefit of Korean Patent Application No. 10-2014-0000832, filed on Jan. 3, 2014, and Korean Patent Application No. 10-2014-0000833, filed on Jan. 3, 2014, in the Korean Intellectual Property Office, the disclosures of which are incorporated herein in their entirety by reference.

BACKGROUND

1. Field

One or more embodiments of the present invention relate to a method of manufacturing a semiconductor package substrate and a semiconductor package substrate manufactured using the method, and more particularly, to a method of manufacturing a semiconductor package substrate which has a simplified process and an upper and lower pattern alignment problem is solved, and a semiconductor package substrate manufactured using the method.

2. Description of the Related Art

A semiconductor device is used by being packaged in a semiconductor package substrate. The semiconductor package substrate in which the semiconductor device is packaged has a fine circuit pattern and/or I/O terminals. As high performance and/or high integration of a semiconductor device and miniaturization and/or high performance of an electronic device using the semiconductor device using the semiconductor device are being pursued, a fine circuit pattern of a semiconductor package substrate has a thinner line width and a higher complexity than circuit patterns in semiconductor package substrates related in the art.

In manufacturing a semiconductor package substrate of a related art, a through-hole is formed using a copper clad laminate (CCL) of accumulated copper foils and an inner surface of the through-hole is plated so that an upper surface copper foil and a lower surface copper foil are electrically connected. Then, the upper surface copper foil and the lower surface copper foil are patterned using photoresist, thereby manufacturing a semiconductor package substrate. However, according to the semiconductor package substrate manufacturing method of the related art, a manufacturing process becomes complicated and precision is lowered.

SUMMARY

One or more embodiments of the present invention include a method of manufacturing a semiconductor package substrate, in which a process is simplified and an upper and lower pattern alignment problem is solved, and a semiconductor package substrate manufactured using the method.

Additional aspects will be set forth in part in the description which follows and, in part, will be apparent from the description, or may be learned by practice of the presented embodiments.

According to one or more embodiments of the present invention, a method of manufacturing a semiconductor package substrate includes forming a first groove in one surface of a base substrate of a conductive material, filling the first groove with resin, and etching another surface of the base substrate to expose the resin filling the first groove.

In the etching of the other surface of the base substrate, a whole surface of the other surface of the base substrate may be etched. In the etching of the other surface of the base substrate, the other surface of the base substrate may be etched such that a pattern of a portion of the base substrate that remains in the one surface of the base substrate corresponds to a pattern of a portion of the base substrate in the other surface of the base substrate.

The method may further include forming a second groove in the other surface of the base substrate.

In the forming of the first groove and the forming of the second groove, a width of the first groove and a width of a second groove may be formed to be different from each other.

In the forming of the first groove and the forming of the second groove, the first groove and the second groove may be formed such that the width of the first groove is larger than the width of a second groove.

In the forming of the first groove and the forming of the second groove, the first groove and the second groove may be formed to correspond to each other.

In the etching of the other surface of the base substrate, a whole surface of the other surface of the base substrate may be etched. In the etching of the other surface of the base substrate, the other surface of the base substrate may be etched such that a pattern of a portion of the base substrate that remains in the one surface of the base substrate corresponds to a pattern of a portion of the base substrate that remains in the other surface of the base substrate.

According to one or more embodiments of the present invention, a semiconductor package substrate is manufactured by the method of manufacturing a semiconductor package substrate includes forming a first groove in one surface of a base substrate of a conductive material, filling the first groove with resin, and etching another surface of the base substrate to expose the resin filling the first groove.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In the following description, it will also be understood that when a layer is referred to as being "on" another layer or substrate, it can be directly on the other layer or substrate, or intervening layers may also be present. Also, the thickness or size of each layer illustrated in the drawings may be exaggerated for convenience of explanation and clarity.

As used herein, the term "and/or" includes any and all combinations of one or more of the associated listed items.

Figure 1:
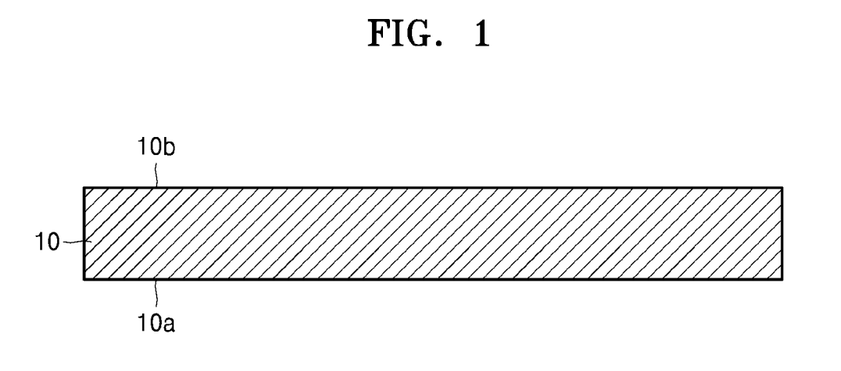
FIGS. 1 to 5 are cross-sectional views schematically illustrating processes of a method of manufacturing a semiconductor package substrate according to an embodiment of the present invention.

FIGS. 1 to 5 are cross-sectional views schematically illustrating processes of a method of manufacturing a semiconductor package substrate according to an embodiment of the present invention. According to the method of manufacturing a semiconductor package substrate according to the present embodiment, as illustrated in FIG. 1, a base substrate 10 formed of a conductive material is prepared. The base substrate 10 may be plate shaped and include an electrically conductive material. An electrically conductive material may include, for example, Fe, an Fe alloy such as Fe—Ni, Fe—Ni—Co, etc., Cu, or a Cu alloy such as Cu—Sn, Cu—Zr, Cu—Fe, Cu—Zn, etc.

Figure 2:
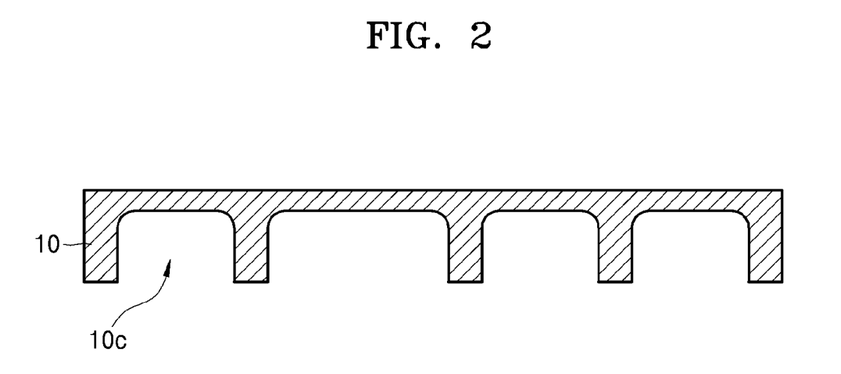

The base substrate 10 may include one surface 10a on one side and one other surface 10b on an opposite side. After the base substrate 10 of a conductive material is prepared, a first groove or trench 10c is formed in the one surface 10a, as illustrated in FIG. 2. The first groove or trench 10c does not completely penetrate the base substrate 10. Although not illustrated in the cross-sectional view of FIG. 1, a portion of the one surface 10a of the base substrate 10, except for the first groove or trench 10c, may be understood as a wiring pattern that is extended in one direction or meanders on a plan view.

To form the first groove or trench 10c as above, a dry film resist (DFR) of a photosensitive material is laminated onto the one surface 10a of the base substrate 10, and only a portion of the base substrate 10 where the first groove or trench 10c is to be formed is exposed through exposure and developing processes. As a result of the exposure and developing processes, a portion of the one surface 10a of the base substrate 10 is no longer covered with DFR. Then, the portion of the one surface 10a of the base substrate 10 which is no longer covered with DFR is etched using an etchant such as copper chloride or ferric chloride. Accordingly, the first groove or trench 10c may be formed in the one surface 10a such that the first groove or trench 10c does not penetrate the base substrate 10, as illustrated in FIG. 2.

A portion that remains on the one surface 10a of the base substrate 10 and is not removed, that is, a portion other than the first groove or trench 10c, may function as a wiring pattern later. Accordingly, when the first groove or trench 10c is formed in the one surface 10a of the base substrate 10, the width of a portion that remains between the neighboring grooves or trenches may be equal to the width of a typical wiring pattern, for example, about 20 μm to about 30 μm.

When the first groove or trench 10c is formed in the one surface 10a of the base substrate 10, the depth of the first groove or trench 10c may be about 80% to about 90% of the thickness of the base substrate 10. For example, the thickness of a remaining portion of the base substrate 10 where the first groove or trench 10c is formed may be about 10 μm to about 40 μm.

When the depth of the first groove or trench 10c is deeper than the above limits, handling the base substrate 10 or a semiconductor package substrate may be difficult in the process of manufacturing a semiconductor package substrate or in the later packaging process. Also, when the depth of the first groove or trench 10c is deeper than the above limits, in some cases, a through-hole penetrating the one surface 10a and the other surface 10b of the base substrate 10 may be formed due to tolerance in forming the first groove or trench 10c. On the other hand, when the depth of the first groove or trench 10c is shallower than the above limits, a subsequent process in the manufacturing of a semiconductor package substrate may be difficult or the thickness of a semiconductor package substrate that is finally manufactured may be excessively thin, which will be described later.

Figure 3:
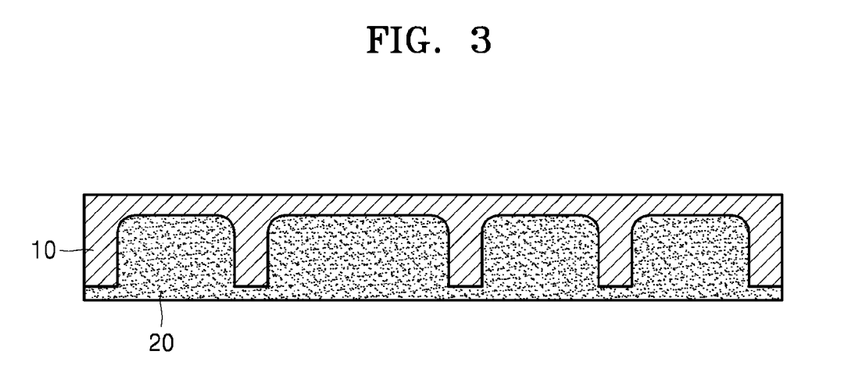

As illustrated in FIG. 3, the first groove or trench 10c of the base substrate 10 is filled with resin 20. The resin 20 may be an insulation material that prevents electrical conduction. For example, the resin 20 may be a thermosetting resin that is hardened by being polymerized by a thermal treatment. The resin 20 electrically insulates between wiring patterns which are later formed on a semiconductor package substrate. The filling with the resin 20 may be achieved by using a liquid resin material or by using a solid-state tape containing a resin component. After the filling with the resin 20, a process of thermosetting the resin 20 in an oven may be performed as necessary.

Figure 4:
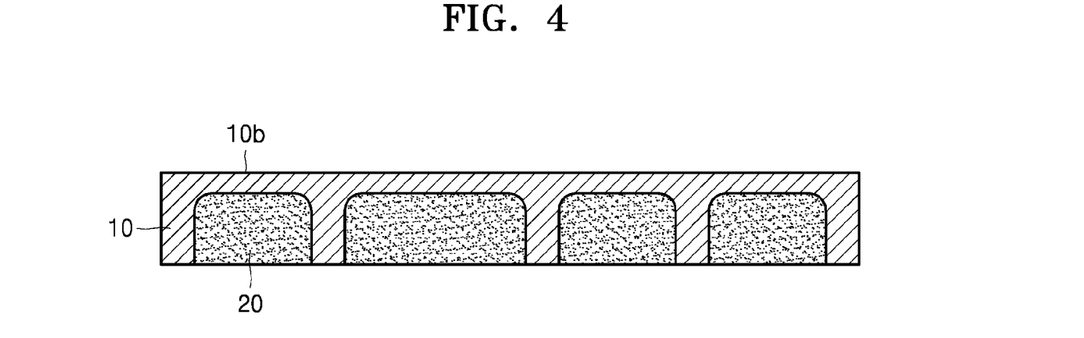

During the filling with the resin 20, as illustrated in FIG. 3, the resin 20 may fill not only the first groove or trench 10c of the base substrate 10, but also at least a part of the one surface 10a of the base substrate 10. When an over-coating of the resin 20 is applied, the over-coating of the resin 20 may be removed by mechanical processing such as brushing, grinding, or abrasion, or by chemical resin etching. Accordingly, as illustrated in FIG. 4, the resin 20 may be located only in the first groove or trench 10c of the base substrate 10.

Figure 5:
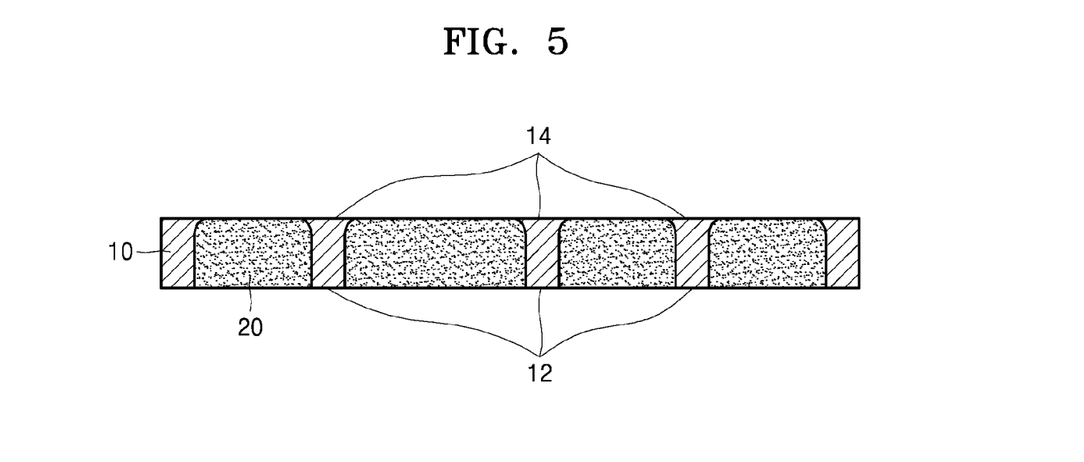

Next, as illustrated in FIG. 5, the other surface 10b of the base substrate 10 is etched to expose the resin 20 that fills the first groove or trench 10c. When the other surface 10b of the base substrate 10 is etched, the other surface 10b of the base substrate 10 is completely etched without using DFR, unlike the case of etching the one surface 10a of the base substrate 10. Accordingly, the etching process of the other surface 10b of the base substrate 10 may be performed very easily and quickly because the patterning process is not needed. To this end, an etchant based of copper chloride, ferric chloride, or a sulfuric acid hydrogen peroxide may be used. According to the above etching, as illustrated in FIG. 5, a wiring pattern 14 that is the same as or similar to a wiring pattern 12 formed between the resin 20 in the one surface 10a may be formed in the other surface 10b of the base substrate 10.

For a semiconductor package substrate, a conductive pattern on an upper surface and a conductive pattern on a lower surface are electrically connected to each other and thus conductive layer patterning of the upper surface and conductive layer patterning of the lower surface are formed as previously set in the above processes. According to a method of manufacturing a semiconductor package substrate of a related art, when a conductive layer of an upper surface is patterned after a conductive layer of a lower surface is patterned, a coating of photoresist is applied for the patterning of the conductive layer of the upper surface and exposure and development are performed. In the above processes, precise alignment between a patterned conductive layer of the lower surface that is previously patterned before the patterning of the conductive layer of the upper surface and a mask used in the above process is needed.

However, according to the method of manufacturing a semiconductor package substrate according to the present embodiment, when the other surface 10b of the base substrate 10 is etched, the other surface 10b of the base substrate 10 is completely etched without using DFR, unlike when the one surface 10a of the base substrate 10 is etched. Accordingly, according to the method of manufacturing a semiconductor package substrate according to the present embodiment, since precise alignment is not needed when the other surface 10b of the base substrate 10 is etched, etching may be performed quickly and manufacturing yield may be remarkably increased.

For the semiconductor package substrate manufactured as above, as illustrated in FIG. 5, the wiring pattern 12 of a portion that remains between the neighboring resins 20 on the one surface 10a of the base substrate 10 and the wiring pattern 14 of a portion that remains between the neighboring resins 20 on the other surface 10b of the base substrate 10 are identical.

When the first groove or trench 10c is formed in the one surface 10a of the base substrate 10 as described above with reference to FIG. 2, the depth of the first groove or trench 10c may be about 80% to about 90% of the thickness of the base substrate 10. When the depth of the first groove or trench 10c is shallower than the above limit, to expose the resin 20, a considerably large amount of the other surface 10b of the base substrate 10 needs to be etched when the other surface 10b of the base substrate 10 is completely etched. When a considerably large amount of the other surface 10b of the base substrate 10 needs to be etched, the manufacturing time increases and also the one surface 10a of the base substrate 10 that has completed the patterning may be damaged. Accordingly, the depth of the first groove or trench 10c needs to be prevented from being shallower than the above limit.

An additional process may be further performed as necessary. For example, at least a part of the remaining portion of the base substrate 10 may be plated by using Au or Pd, or organic solderability preservative (OSP) coating may be performed on at least a part of the remaining portion of the base substrate 10. This is to increase solder adhesive strength of the remaining portion of the base substrate 10.

Figure 6:
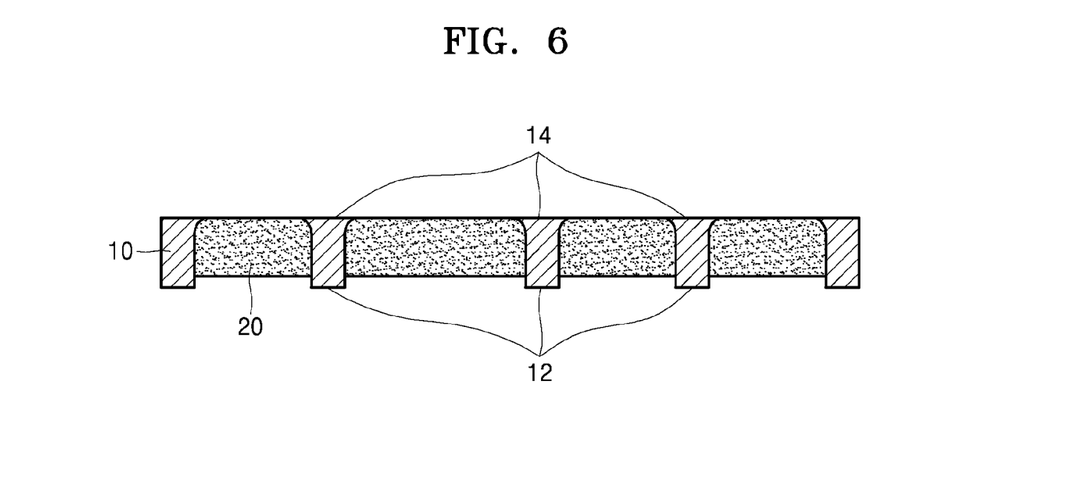
FIG. 6 is a cross-sectional view schematically illustrating a part of a semiconductor package substrate manufactured by a method of manufacturing a semiconductor package substrate according to another embodiment of the present invention.

FIG. 6 is a cross-sectional view schematically illustrating a part of a semiconductor package substrate manufactured by a method of manufacturing a semiconductor package substrate according to another embodiment of the present invention. As illustrated in FIG. 6, in one surface of the base substrate 10, a remaining portion, that is, a ball land surface, of the one surface of the base substrate 10 may protrude further than an outer surface of the resin 20. Accordingly, when a solder ball is later attached to the remaining portion of the one surface of the base substrate 10, the solder ball and the remaining portion of the one surface of the base substrate 10 may be firmly attached to each other.

To this end, a sulfuric acid based etchant may be used. In other words, as a part of the outer surface of the resin 20 is removed by using the sulfuric acid based etchant, the remaining portion of the one surface of the base substrate 10 may protrude above the outer surface of the resin 20 on the one surface of the base substrate 10. As such, the removing of a part of the outer surface of the resin 20 by using the sulfuric acid based etchant may be performed before etching the other surface 10b of the base substrate 10. In the above process, when the part of the outer surface of the resin 20 on the one surface 10a of the base substrate 10 is removed after the other surface 10b of the base substrate 10 is etched to expose the resins 20 that fill the first groove or trench 10c, the patterning of the other surface 10b of the base substrate 10 may be damaged or the outer surface of the resin 20 on the other surface 10b may be removed.

Figure 7:
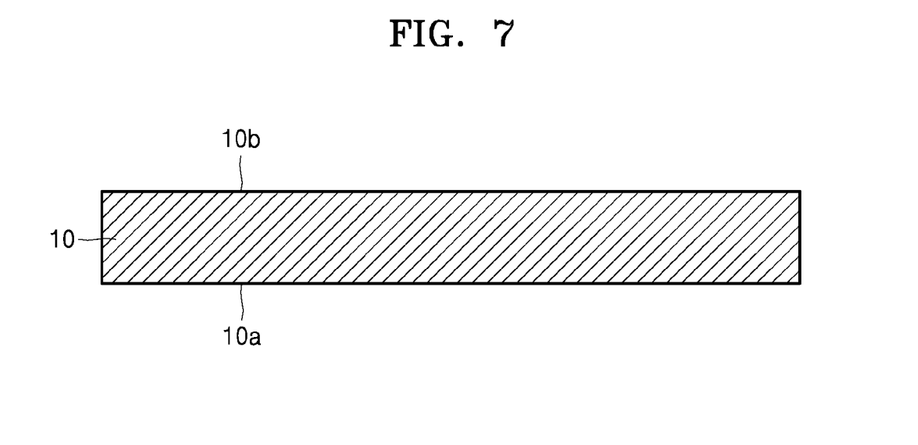
FIGS. 7 to 11 are cross-sectional views schematically illustrating processes of a method of manufacturing a semiconductor package substrate according to another embodiment of the present invention.

FIGS. 7 to 11 are cross-sectional views schematically illustrating processes of a method of manufacturing a semiconductor package substrate according to another embodiment of the present invention. As illustrated in FIG. 7, according to the method of manufacturing a semiconductor package substrate according to the present embodiment, the base substrate 10 of a conductive material is prepared. The base substrate 10 is the same as that described with reference to FIG. 1.

Figure 8:
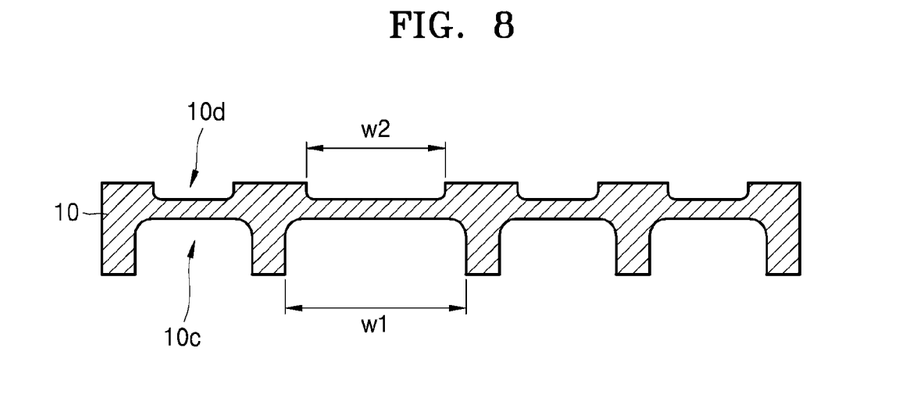

The base substrate 10 may include one surface 10a on one side and one other surface 10b on an opposite side. After the base substrate 10 of a conductive material is prepared, the first groove or trench 10c is formed in the one surface 10a, as illustrated in FIG. 8. The first groove or trench 10c does not completely penetrate the base substrate 10. Although not illustrated in the cross-sectional view of FIG. 8, a portion except for the first groove or trench 10c of the one surface 10a of the base substrate 10 may be understood as a wiring pattern that is extended in one direction or meanders on a plan view.

To form the first or trench 10c, a DFR of a photosensitive material is laminated onto the one surface 10a of the base substrate 10 and only a portion of the base substrate 10 where the first groove or trench 10c of the base substrate 10 is to be formed is exposed through exposure and developing processes. As a result of the exposure and developing processes, a portion of the one surface 10a of the base substrate 10 is no longer covered with DFR. Then, the portion of the one surface 10a of the base substrate 10 that is not covered with DFR is etched using an etchant such as copper chloride or ferric chloride. Accordingly, the first groove or trench 10c may be formed in the one surface 10a such that the first groove or trench 10c does not penetrate the base substrate 10, as illustrated in FIG. 8.

A portion that remains, is not removed, on the one surface 10a of the base substrate 10, that is, a portion other than the first groove or trench 10c, may function as a wiring pattern later. Accordingly, when the first groove or trench 10c is formed in the one surface 10a of the base substrate 10, the width of a portion that remains between the neighboring grooves or trenches may be equal the width of a typical wiring pattern, for example, about 20 μm to about 30 μm.

Also, a second groove or trench 10d is formed in the other surface 10b of the base substrate 10 of a conductive material, as illustrated in FIG. 8. The second groove or trench 10d does not completely penetrate the base substrate 10. Although not illustrated in the cross-sectional view of FIG. 8, a portion except for the second groove or trench 10d of the other surface 10b of the base substrate 10 may be understood as a wiring pattern that is extended in one direction or meanders on a plan view. The forming of the second groove or trench 10*d* may be performed in the same as or similar to the above-described method for forming the first groove or trench 10*c*.

A portion that remains on the other surface 10*b* of the base substrate 10 and is not removed, that is, a portion other than the second groove or trench 10*d*, may function as a wiring pattern later. Accordingly, when the second groove or trench 10*d* is formed in the other surface 10*b* of the base substrate 10, the width of a portion that remains between the neighboring first grooves or the neighboring first trenches may be equal to the width of a typical wiring pattern, for example, about 20 μm to about 30 μm.

When the first groove or trench 10*c* is formed and when the second groove or trench 10*d* is formed, the first groove or trench 10*c* and the second groove or trench 10*d* may be formed corresponding to each other. A width w1 of the first groove or trench 10*c* and a width w2 of the second groove or trench 10*d* may be formed to be different from each other. This is to make a wiring pattern or width on one surface of a semiconductor package substrate to be different from a wiring pattern or width on the other surface of a semiconductor package substrate, which will be described later.

Also, the second groove or trench 10*d* may be formed after the first groove or trench 10*c* is formed. Alternatively, the first groove or trench 10*c* may be formed after the second groove or trench 10*d* is formed.

The first groove or trench 10*c* and the second groove or trench 10*d* may be formed at the same time. For example, DFR is laminated onto the one surface 10*a* and the other surface 10*b* of the base substrate 10 and then exposure and developing processes are performed so that only a portion of the one surface 10*a* of the base substrate 10 where the first groove or trench 10*c* is to be formed and a portion of the other surface 10*b* of the base substrate 10 where the second groove or trench 10*d* is to be formed are exposed. Next, portions on the one surface 10*a* and the other surface 10*b* of the base substrate 10, which are not covered with DFR, are simultaneously etched by using an etchant such as copper chloride or ferric chloride so that the first groove or trench 10*c* formed in the one surface 10*a* and the second groove or trench 10*d* formed in the other surface 10*b* do not penetrate through the base substrate 10, may be simultaneously formed as illustrated in FIG. 8. As such, since the first groove or trench 10*c* and the second groove or trench 10*d* are simultaneously formed, the manufacturing process maybe simplified and the time and costs for manufacturing may be remarkably reduced. The DFR that covers the one surface 10*a* of the base substrate 10 and the DFR that covers the other surface 10*b* of the base substrate 10 may be simultaneously developed and a variety of modifications may be available.

When the first groove or trench 10*c* is formed in the one surface 10*a* of the base substrate 10 and the second groove or trench 10*d* is formed in the other surface 10*b* of the base substrate 10, as illustrated in FIG. 8, a sum of the depth of the first groove or trench 10*c* and the depth of the second groove or trench 10*d* may be about 80% to about 90% of the thickness of the base substrate 10. For example, a thickness of a remaining portion where the first groove or trench 10*c* of the base substrate 10 or the second groove or trench 10*d* of the base substrate 10 is formed may be about 10 μm to about 40 μm.

When the sum of the depth of the first groove or trench 10*c* and the depth of the second groove or trench 10*d* is greater than about 80% to about 90% of the thickness of the base substrate 10, handling of the base substrate 10 or the semiconductor package substrate may be difficult in the process of manufacturing the semiconductor package substrate or a subsequent packaging process. Also, in some cases, in the forming of the first groove or trench 10*c* and/or the second groove or trench 10*d*, a through hole that penetrates through the one surface 10*a* and the other surface 10*b* of the base substrate 10 may be formed due to tolerance in forming the first groove or trench 10*c* and/or the second groove or trench 10*d*. When the sum of the depth of the first groove or trench 10*c* and the depth of the second groove or trench 10*d* is smaller than about 80% to about 90% of the thickness of the base substrate 10, a subsequent process in the manufacturing of a semiconductor package substrate layer may be difficult or the thickness of a semiconductor package substrate that is finally manufactured may be too thin, which will be described later.

Figure 9:
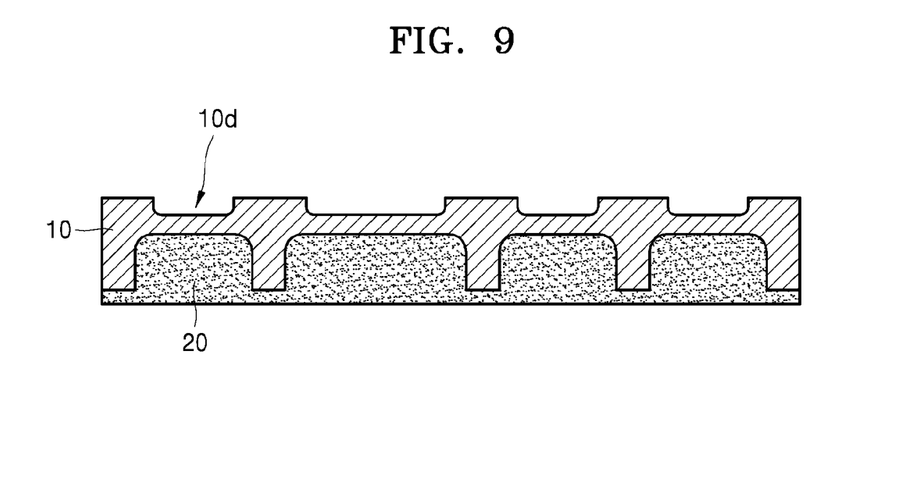

Then, as illustrated in FIG. 9, the first groove or trench 10*c* of the base substrate 10 is filled with the resin 20. The resin 20 is formed of an insulation material that sufficiently prevents electrical conduction. For example, the resin 20 may be thermosetting resin that is hardened by being polymerized by a thermal treatment. The resin 20 electrically insulates between wiring patterns which are later formed on a semiconductor package substrate. The filling with the resin 20 may be achieved by using a liquid resin material or by using a solid-state tape containing a resin component. After the filling with the resin 20, a process of thermosetting the resin 20 in an oven may be performed as necessary.

Figure 10:
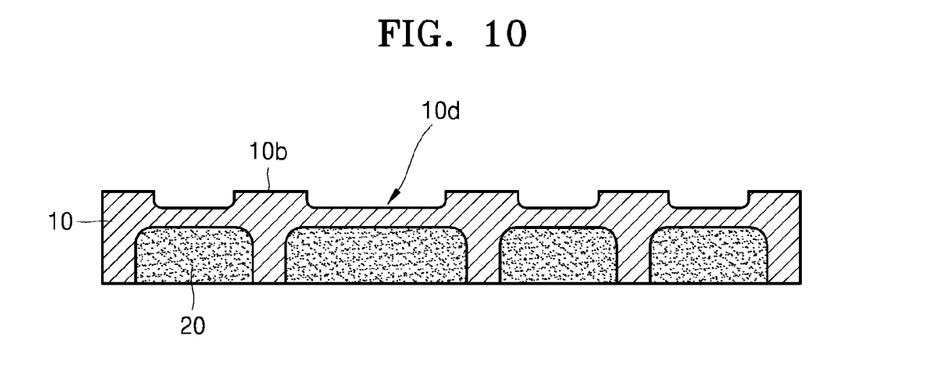

During the filling with the resin 20, the resin 20 may not only fill the first groove or trench 10*c* of the base substrate 10 but also cover at least a part of the one surface 10*a* of the base substrate 10 as illustrated in FIG. 9. As such, when the resin 20 is over-coated, the resin 20 that is over-coated may be removed by mechanical processing such as brushing, grinding, or abrasion, or by chemical resin etching. Accordingly, as illustrated in FIG. 10, the resin 20 may be located only in the first groove or trench 10*c* of the base substrate 10.

Figure 11:
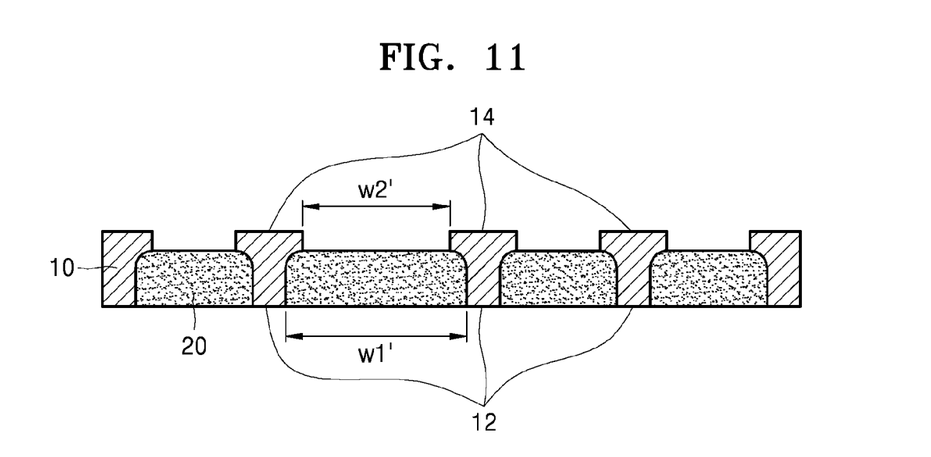

Next, as illustrated in FIG. 11, the other surface 10*b* of the base substrate 10 is etched to expose the resin 20 that fills the first groove or trench 10*c*. When the other surface 10*b* of the base substrate 10 is etched, the other surface 10*b* of the base substrate 10 is completely etched without using DFR. Accordingly, the etching process of the other surface 10*b* of the base substrate 10 may be performed very easily and quickly because the patterning process is not needed. To this end, an etchant based on copper chloride, ferric chloride, or a sulfuric acid hydrogen peroxide may be used. According to the above etching, as illustrated in FIG. 11, the wiring pattern 14 that is similar to the wiring pattern 12 formed between the resin 20 in the one surface 10*a* may be formed in the other surface 10*b* of the base substrate 10.

Since the second groove or trench 10*d* exists in the other surface 10*b* of the base substrate 10, as the second groove or trench 10*d* is etched, a portion of the resin 20 corresponding to the second groove or trench 10*d* is exposed. In other words, the wiring pattern 14 of the other surface 10*b* of the base substrate 10 corresponds to the wiring pattern 12 of the one surface 10*a* of the base substrate 10. Since the shape or size of the second groove or trench 10*d* is determined when the second groove or trench 10*d* is initially formed in the other surface 10*b* of the base substrate 10, the shape of the wiring pattern of the other surface 10*d* of the base substrate 10 may be determined.

According to the method of manufacturing a semiconductor package substrate according to the present embodiment, the manufacturing process is simplified and also the shapes of the upper and lower patterns may be made in a variety of ways. Referring to FIG. 8, as described above, the width w1 of the first groove or trench 10c and the width w2 of the second groove or trench 10d may be formed to be different from each other. Accordingly, the wiring pattern or width on one surface of a completed semiconductor package substrate is different from the wiring pattern or width on the other surface of a semiconductor package substrate, as illustrated in FIG. 11. This is because a width w1' of a surface where the resin 10 is exposed on the one surface 10a of the base substrate 10 corresponds to the width w1 of the first groove or trench 10c of FIG. 8 and a width w2' of a surface where the resin 10 is exposed on the other surface 10b of the base substrate 10 corresponds to the width w2 of the second groove or trench 10d of FIG. 8

According to the method of manufacturing a semiconductor package substrate according to the present embodiment, while the width or shape of the wiring pattern 14 on the other surface 10b and the width or shape of the wiring pattern 12 on the one surface 10a are formed to be different from each other, the manufacturing process may be simplified, unlike the method of manufacturing a semiconductor package substrate of a related art. In particular, when the processes of developing the photoresist covering the one surface 10a of the base substrate 10 and the photoresist covering the other surface 10b are simultaneously formed during the forming of the first groove or trench 10c and the second groove or trench 10d, the width or shape of the wiring pattern 14 on the other surface 10b and the width or shape of the wiring pattern 12 on the one surface 10a are formed to be different from each other and also the manufacturing process may be remarkably simplified, unlike the method of manufacturing a semiconductor package substrate of a related art.

When the first groove or trench 10c and the second groove or trench 10d are formed in the base substrate 10 as described above with reference to FIG. 8, the sum of the depth of the first groove or trench 10c and the depth of the second groove or trench 10d may be about 80% to about 90% of the thickness of the base substrate 10. When the sum of the depth of the first groove or trench 10c and the depth of the second groove or trench 10d is smaller than about 80% to about 90% of the thickness of the base substrate 10, a considerably large amount of the other surface 10b of the base substrate 10 is etched to expose the resin 20 during the total etching of the other surface 10b of the base substrate 10. If a considerably large amount of the other surface 10b of the base substrate 10 is etched, a manufacturing time increases and also the first groove or trench 10c and/or the second groove or trench 10d of the base substrate 10 that are already patterned may be damaged. Accordingly, the sum of the depth of the first groove or trench 10c and the depth of the second groove or trench 10d may not be less than about 80% to about 90% of the thickness of the base substrate 10.

Before filling the first groove or trench 10c with the resin, in the forming of the first groove or trench 10c and the second groove or trench 10d, the width w1 of the first groove or trench 10c may be greater than the width w2 of the second groove or trench 10d. Accordingly, by filing a large empty space in the base substrate 10 with the resin 20, a ratio of the empty space in the semiconductor package substrate is reduced when the semiconductor package substrate is completed, as illustrated in FIG. 11, so that mechanical strength or endurance of the semiconductor package substrate may be improved.

An additional process may be further provided as necessary. For example, at least a part of the remaining portion of the base substrate 10 is plated by using Au or Pd, or OSP coating may be performed on at least a part of the remaining portion of the base substrate 10. This is to increase solder adhesive strength of the remaining portion of the base substrate 10.

In the semiconductor package substrate manufactured as above, as illustrated in FIG. 11, the wiring pattern 12 of a portion that remains between the neighboring resins 20 on the one surface 10a of the base substrate 10 and the wiring pattern 14 of a portion that remains between the neighboring resins 20 on the other surface 10b of the base substrate 10 may correspond to each other. However, the present invention is not limited thereto. For example, as illustrated in FIGS. 12 and 13, which are cross-sectional views schematically illustrating processes of a method of manufacturing a semiconductor package substrate according to another embodiment of the present invention, at least a part of the wiring pattern 12 of a portion that remains between the neighboring resins 20 on the one surface 10a of the base substrate 10 and at least a part of the wiring pattern 14 of a portion that remains between the neighboring resins 20 on the other surface 10b of the base substrate 10 may not correspond to each other.

Figure 12:
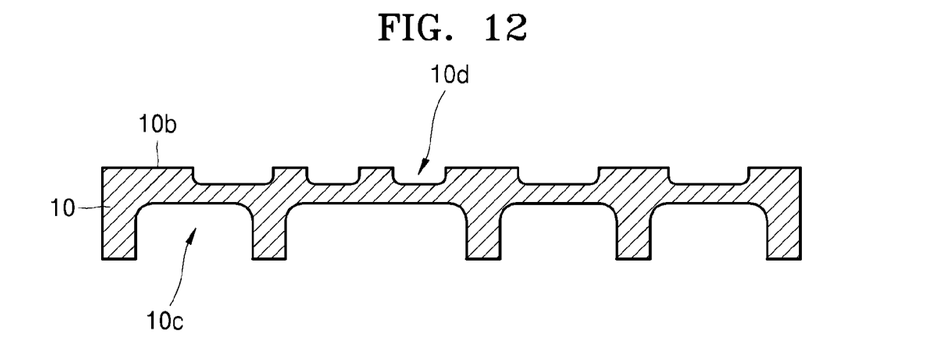
FIGS. 12 and 13 are cross-sectional views schematically illustrating processes of a method of manufacturing a semiconductor package substrate according to another embodiment of the present invention.
Figure 13:
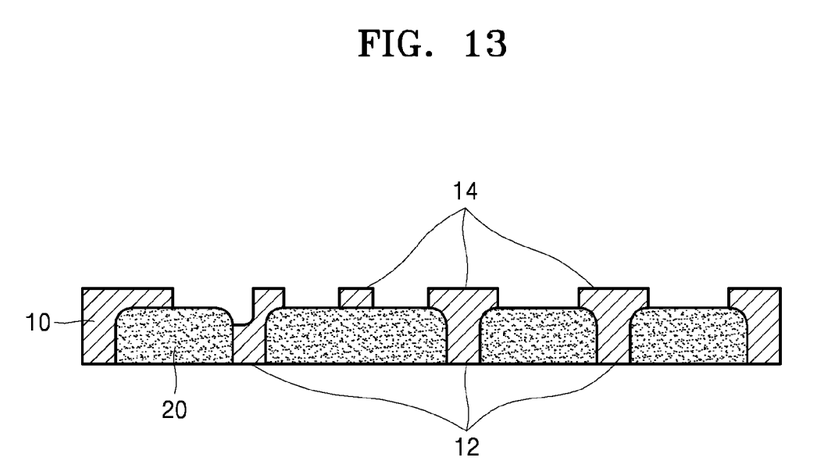

In other words, as illustrated in FIG. 12, after at least a part of the first groove or trench 10c on the one surface 10a of the base substrate 10 and at least a part of the second groove or trench 10d on the other surface 10b of the base substrate 10 are formed not to correspond to each other, the first groove or trench 10c of the base substrate 10 is filled with the resin 20 and the other surface 10b of the base substrate 10 is etched so that the resin 20 is exposed as illustrated in FIG. 13. In this connection, at least a part of the wiring pattern 12 of a portion that remains between the neighboring resins 20 on the one surface 10a of the base substrate 10 and at least a part of the wiring pattern 14 of a portion that remains between the neighboring resins 20 on the other surface 10b of the base substrate 10 may not correspond to each other. According to the method of manufacturing a semiconductor package substrate according to the present embodiment, the manufacturing process may be simplified and the shapes of the upper pattern and the lower pattern may be made in a variety of ways.

Figure 14:
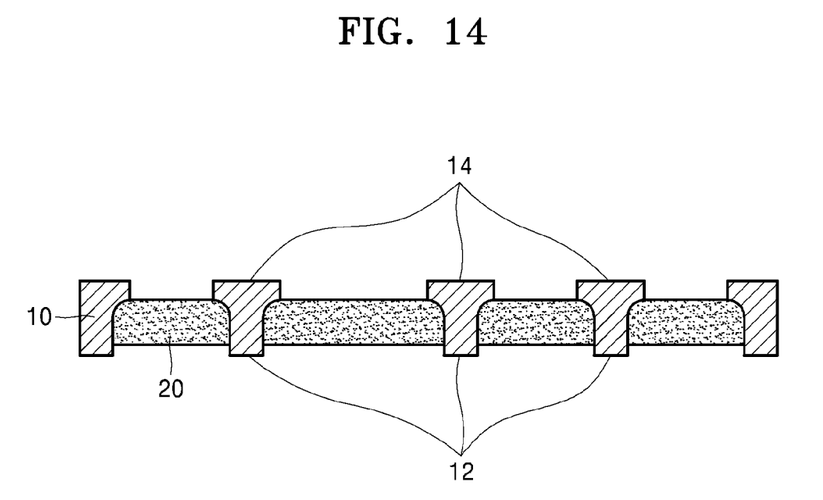
FIG. 14 is a cross-sectional view schematically illustrating a part of a semiconductor package substrate manufac-

FIG. 14 is a cross-sectional view schematically illustrating a part of a semiconductor package substrate manufactured by a method of manufacturing a semiconductor package substrate according to another embodiment of the present invention. As illustrated in FIG. 14, in one surface of the base substrate 10, a remaining portion, that is, a ball land surface, of the one surface of the base substrate 10 may protrude further than an outer surface of the resin 20. Accordingly, when a solder ball is later attached to the remaining portion of the one surface of the base substrate 10, the solder ball and the remaining portion of the one surface of the base substrate 10 may be firmly attached to each other.

To this end, a sulfuric acid based etchant may be used. In other words, as a part of the outer surface of the resin 20 is removed by using the sulfuric acid based etchant, the remaining portion of the one surface of the base substrate 10 may protrude above the outer surface of the resin 20 on the one surface of the base substrate 10. As such, the removing of a part of the outer surface of the resin 20 by using the sulfuric acid based etchant may be performed before etching the other surface 10b of the base substrate 10. In the above process, when the part of the outer surface of the resin 20 on the one surface 10a of the base substrate 10 is removed after the other surface 10b of the base substrate 10 is etched to expose the resins 20 that fill the first groove or trench 10c, the patterning of the other surface 10b of the base substrate 10 may be damaged or the outer surface of the resin 20 on the other surface 10b may be removed.

Although the method of manufacturing a semiconductor package substrate is described above, the present invention is not limited thereto. For example, a semiconductor package substrate manufactured by using the above method, may belong to the scope of the present invention.

As described above, according to the one or more of the above embodiments of the present invention, a method of manufacturing a semiconductor package substrate in which a process is simplified and an upper and lower pattern alignment problem is solved, and a semiconductor package substrate manufactured by using the method, may be embodied. However, the effect does not limit the scope of the present invention.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method of manufacturing a semiconductor package substrate, the method comprising:
    forming a first groove in a first surface of a base substrate of a conductive material;
    forming a second groove in a second surface of the base substrate;
    after forming the first groove and the second groove, filling the first groove with resin; and
    after filling the first groove with resin, etching the second surface of the base substrate at the second groove to expose the resin filling the first groove.

2. The method of claim 1, wherein, in the etching of the second surface of the base substrate, a whole surface of the second surface of the base substrate is etched.

3. The method of claim 2, wherein, in the etching of the second surface of the base substrate, the second surface of the base substrate is etched such that a pattern of a portion of the base substrate that remains in the first surface of the base substrate corresponds to a pattern of a portion of the base substrate in the second surface of the base substrate.

4. The method of claim 1, wherein, in the forming of the first groove and the forming of the second groove, a width of the first groove and a width of the second groove are formed to be different from each other.

5. The method of claim 4, wherein, in the forming of the first groove and the forming of the second groove, the first groove and the second groove are formed such that the width of the first groove is larger than the width of the second groove.

6. The method of claim 4, wherein, in the forming of the first groove and the forming of the second groove, the first groove and the second groove are formed to correspond to each other.

7. The method of claim 1, wherein, in the etching of the second surface of the base substrate, a whole surface of the second surface of the base substrate is etched.

8. The method of claim 7, wherein, in the etching of the second surface of the base substrate, the second surface of the base substrate is etched such that a pattern of a portion of the base substrate that remains in the first surface of the base substrate corresponds to a pattern of a portion of the base substrate that remains in the second surface of the base substrate.

9. A semiconductor package substrate manufactured by the method of claim 1.

* * * * *